United States Patent [19]
Smith et al.

[11] Patent Number: 5,011,244
[45] Date of Patent: Apr. 30, 1991

[54] HOLOGRAPHIC FULL COLOR DATA RETRIEVAL AND PROJECTION SYSTEM

[75] Inventors: Ronald T. Smith, Redondo Beach; Ronald G. Hegg, Inglewood, both of Calif.

[73] Assignee: Hughes Aircraft Company, Los Angeles, Calif.

[21] Appl. No.: 285,898

[22] Filed: Dec. 16, 1988

[51] Int. Cl.$^5$ .............................................. G03H 1/26
[52] U.S. Cl. .................................. 350/3.75; 350/3.7; 350/3.77; 350/3.78
[58] Field of Search ...................... 350/3.6, 3.67, 3.70, 350/3.73, 3.75, 3.77, 3.78, 3.81

[56] References Cited

U.S. PATENT DOCUMENTS

| | | | |
|---|---|---|---|
| 4,367,366 | 1/1983 | Gloss et al. | 350/3.73 |
| 4,669,812 | 6/1987 | Hoebing | 350/3.78 |
| 4,807,978 | 2/1989 | Grinberg et al. | 350/3.73 |
| 4,818,048 | 4/1989 | Moss | 350/3.7 |
| 4,830,442 | 5/1989 | Moss | 350/3.7 |

Primary Examiner—Bruce Y. Arnold
Assistant Examiner—Jay P. Ryan
Attorney, Agent, or Firm—L. A. Alkov; M. J. Meltzer; A. W. Karambelas

[57] ABSTRACT

A holographic full-color, data retrieval and projection system includes a holographic information storage plate that includes a plurality of reflective holograms, each designed to diffract light over a certain spectral bandwidth, and a holographic screen character plate, which includes a plurality of screen hologram character shapes that reflect diffracted light in a uniform, well-defined cone of diffuse light directed toward the viewer, producing images having high screen gain and high brightness, yet with lower power consumption than heretofore obtained.

6 Claims, 20 Drawing Sheets

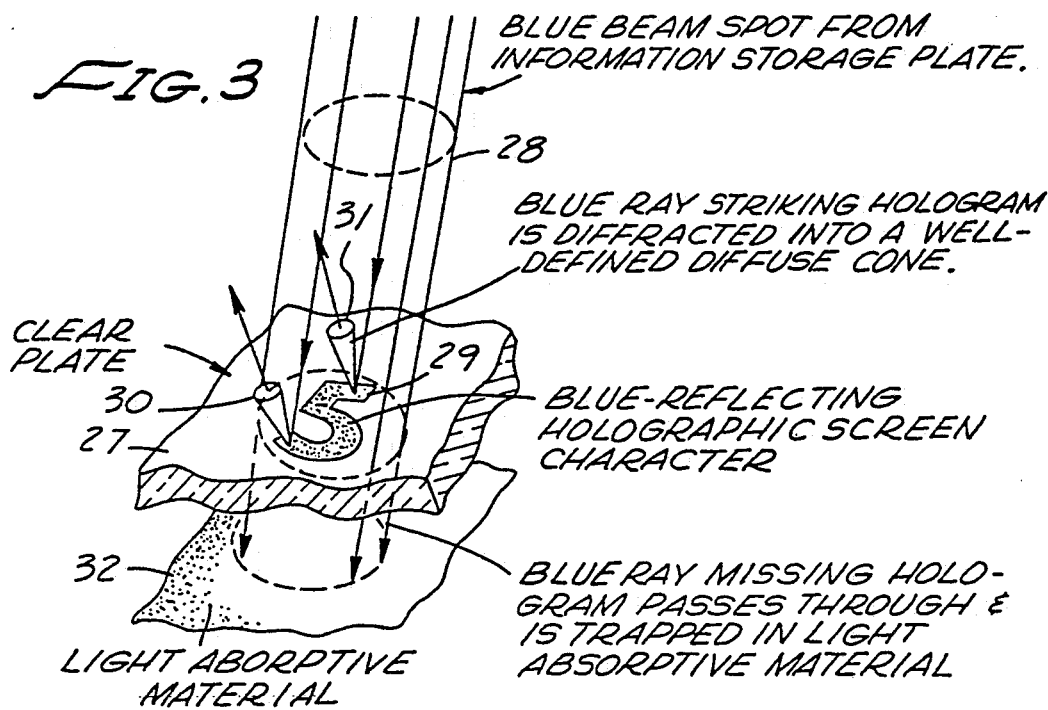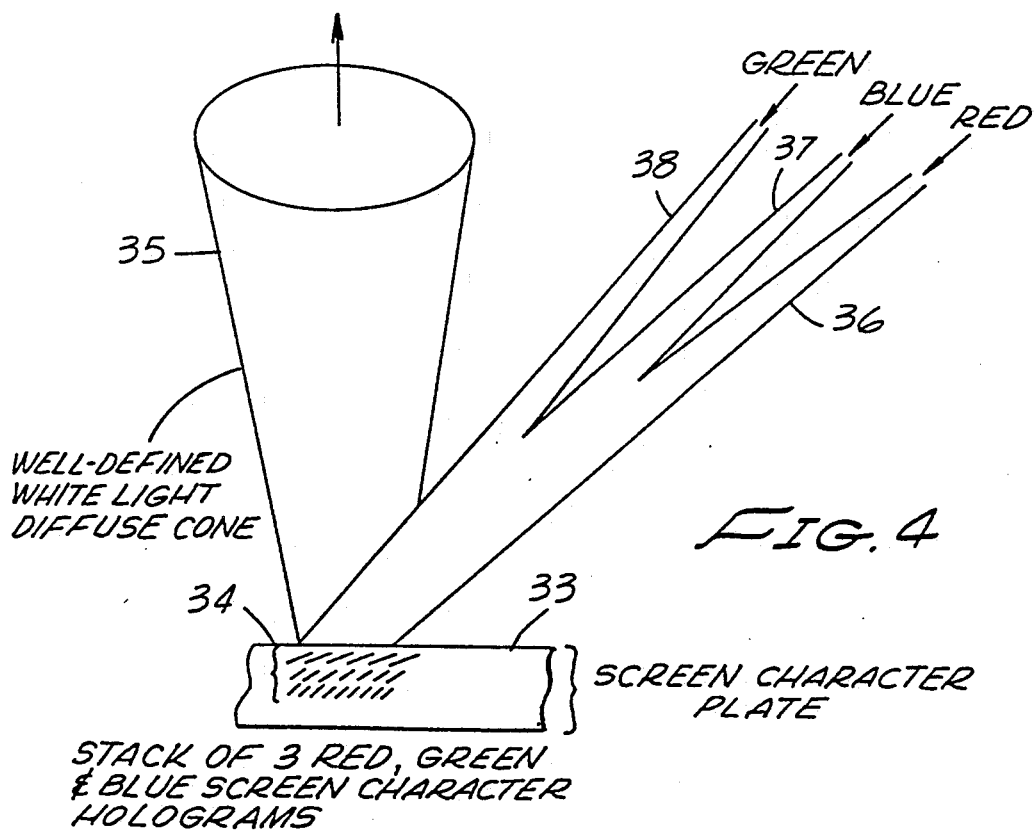

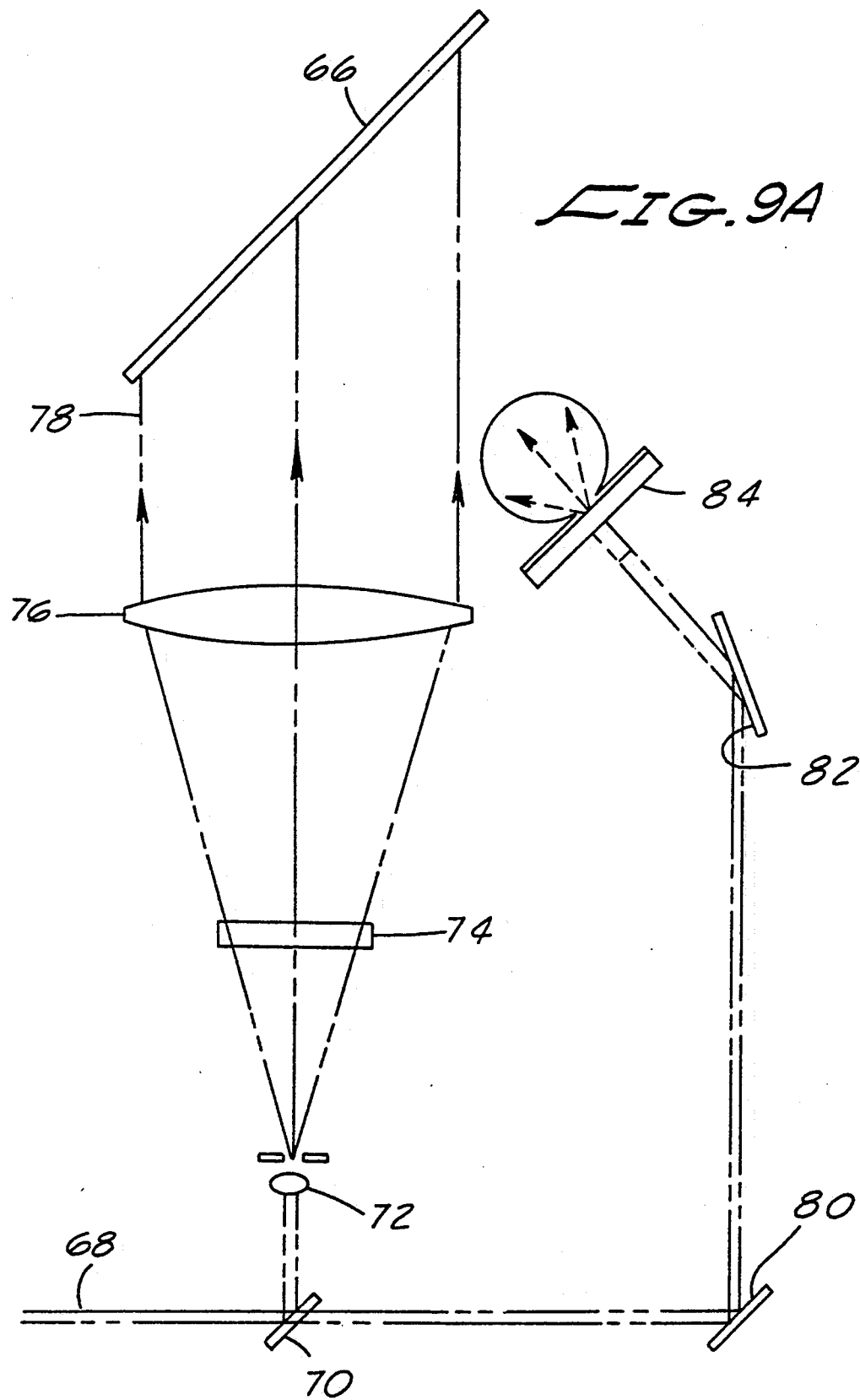

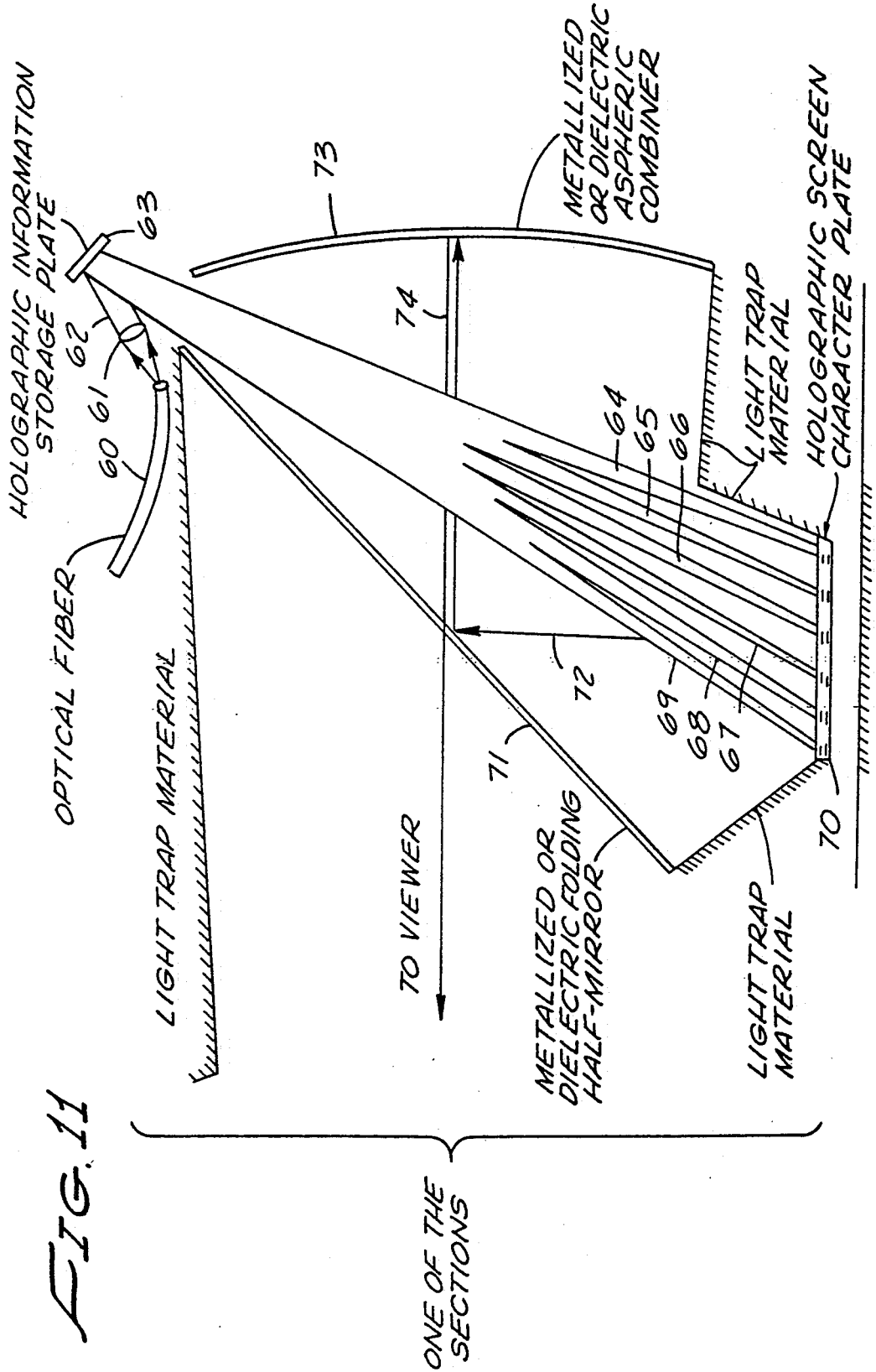

HOLOGRAPHIC FULL COLOR DATA RETRIEVAL AND PROJECTION SYSTEM

BACKGROUND OF THE INVENTION

1. Field of the Invention

This invention relates to a system for providing high brightness, high contrast image sources that consume minimal electrical power, and that include a holographic information storage plate and a holographic projection screen. The storage plate diffracts at least 70% and preferably at least 80% of incident light, and directs the diffracted light toward predetermined, desired areas on the holographic screen character plate. At the holographic screen character plate, the incident light from the information storage plate is diffused and directed entirely into the viewer's line of sight for optimum brightness.

2. Description of Related Art

Optical holographic data storage provides a high density fixed data base. One such system involves the storage and retrieval of data from a Fourier transform transmission hologram. Such a system uses a lens arrangement for data retrieval and requires considerable space. The use of a transmission hologram in a Fourier transform data system precludes the use of a double-sided holographic memory plate.

Another conventional holographic data storage system increases storage capacity by recording multiple holograms at different polarizations. In such a system, the retrieval or playback is at different polarization angles. Such a system is complex and bulky.

Another prior optical data storage system is commonly called the "optical disc." In such a system, the data is stored in binary form as a series of small holes. The presence of a hole is equivalent to a one state, and the absence of a hole is equivalent to a zero state. The hole is very small, on the order of one to two micrometers. During the retrieval process, the disc is rotated at high speed. The distance between the disc and detecting head is very small, typically two to ten micrometers. The disc can store a large amount of data, but accurate playback is susceptible to vibration and movement. The optical disc system is not usable in a vibrating environment such as a vehicle.

None of these systems is sufficiently rugged, resistant to vibration, high in contrast, and low in power consumption to be of practical use where high-density, small size, short data access time requirements and severe environmental conditions exist, as in aircraft, space, automobile and other uses.

SUMMARY OF THE INVENTION

This invention relates to systems and methods for projecting high brightness, high contrast images while consuming minimal electrical power. Such systems comprise at least one holographic information storage plate means and at least one holographic screen character storage plate means. These systems can also include means for producing a highly collimated, small diameter beam of light that appears to approximate a point light source.

The holographic information storage plate includes a plurality of holograms, each designed to diffract incident light over a predetermined, desired spectral bandwidth. Each hologram can lie entirely within a single gelatin layer. Alternatively, each may consist of a stack of gelatin layers with each layer incorporating one or more holograms. The holographic information storage plate may include a plurality of holograms, each hologram having a narrow bandwidth of spectral response, or a plurality, smaller in number, of holograms, each having a wider bandwidth of spectral response. The spectral bandwidths of response for each hologram should be sufficiently distinct from the spectral bandwidths of the other holograms in the plate means to minimize diffraction of an unintended, undesired wavelength of light by one or more holograms in the array.

The holographic information storage plate separates a collimated beam of incident white light into a plurality of diffracted, reflected light beams of differing colors, and directs these diffracted, reflected beams of color or, more specifically, beams of predetermined, desired spectral bandwidth, onto predetermined, desired locations of characters on one or more screen character storage plate means. For example, green incident light striking the information storage plate is diffracted by the information storage plate substantially entirely toward green diffracting characters on the screen character storage plate means; yellow incident light, toward yellow diffracting characters on the screen character storage plate means; and red light, toward red diffracting characters on the screen character storage plate.

The holographic screen character plate comprises one or more, and preferably a plurality of light-reflective, light-diffracting, light-diffusing optical elements, each element having the size and shape of a predetermined, desired character. Each character diffracts light lying within a wavelength band which includes the light incident on the character. The screen character diffracts incident light in a uniform, well-defined bundle, e.g., a cone of diffuse light, and directs that cone of light toward the viewer. If the viewer's exit pupil is relatively small and situated sufficiently far from the screen character plate, the screen character holograms focus the light into that area. Each of the screen character hologram elements is tuned to diffract a predetermined, desired color of light, and to transmit all other light colors incident thereon. White characters can be generated by having green, red and blue spotlights from the information storage plate illuminate a stack of green-diffracting, red-diffracting and blue-diffracting screen characters.

This invention also includes methods for generating high contrast, high brightness images comprising: illuminating a holographic information storage plate means with a collimated, small diameter beam of white light; directing light beams of differing spectral bandwidth diffracted and reflected from the information storage plate means to the surface of a holographic screen character plate means; and reflecting these light beams from predetermined, desired areas shaped as characters on the information storage plate means toward a viewing area that subtends a small angle.

The holographic information storage plate is preferably made by directing argon laser light of a predetermined, desired wavelength, as a collimated reference beam, onto the surface of a dichromated gelatin plate (DCG plate). Simultaneously, the other side of the DCG plate is exposed to a diffuse object beam created by the passage of light through a focusing lens contiguous with a holographic silver halide or ground-glass diffusing screen contiguous to a predistorted information reticle. The reticle image is predistorted during exposure at the exposure wavelength so that for playback at the playback wavelength, the image will be rectilinear. To minimize exposure/playback problems, the exposure wavelength is preferably the same as or approximately the same as the playback wavelength. For example, to make violet and blue holograms, the incident argon laser light may be the 488 nanometer line of an argon laser. To make green and yellow holograms, the incident light can be the 515 nanometer line from an argon laser. To make orange and red exposures, the 647 nanometer krypton laser line can be used DCG is the preferred holographic film for argon laser exposures because of its low scatter properties and large dynamic range. For krypton exposures, either dye-sensitized DCG, photopolymer film or other films can be used.

To make the holographic screen character plate, the laser light of appropriate wavelength is directed through a holographic silver-halide or ground-glass diffusing screen to create a diffuse object beam. The diffuse object beam is directed onto an information reticle, and passes through the reticle onto a DCG plate. A reference beam is also directed onto the DCG plate through a corresponding information reticle by a focusing lens. The selection of laser lines and film material should be the same for the screen character plate as for the information storage plate.

BRIEF DESCRIPTION OF THE DRAWINGS

FIG. 3 is a diagrammatic view of a character on the holographic screen character plate shown in FIGS. 1 and 2.

FIG. 4 is a diagrammatic view of the diffraction pattern from a holographic screen character plate character designed to produce white reflected light.

FIGS. 9A and 9B disclose a preferred method for making the holographic information storage hologram plate shown in FIGS. 1 and 2.

FIG. 11 shows a virtual image display system that includes the system shown in FIG. 1.

FIG. 1 shows a diagrammatic view of a preferred embodiment of a holographic data retrieval and projection system, generally designated 1. The system includes broadband light source 2. Light source 2 produces white light rays 3 that pass through collimating lens 4 and then strike information storage plate 5 in the form of collimated beam 6 of white light. For example, this lamp can be an ANSI standard 1874 10-watt, tungsten-filament lamp. Lens 4 has a sufficiently long focal length to make the lamp filament appear nearly like a point source so that collimated beam 6 has a small cross-section.

Figure 1:
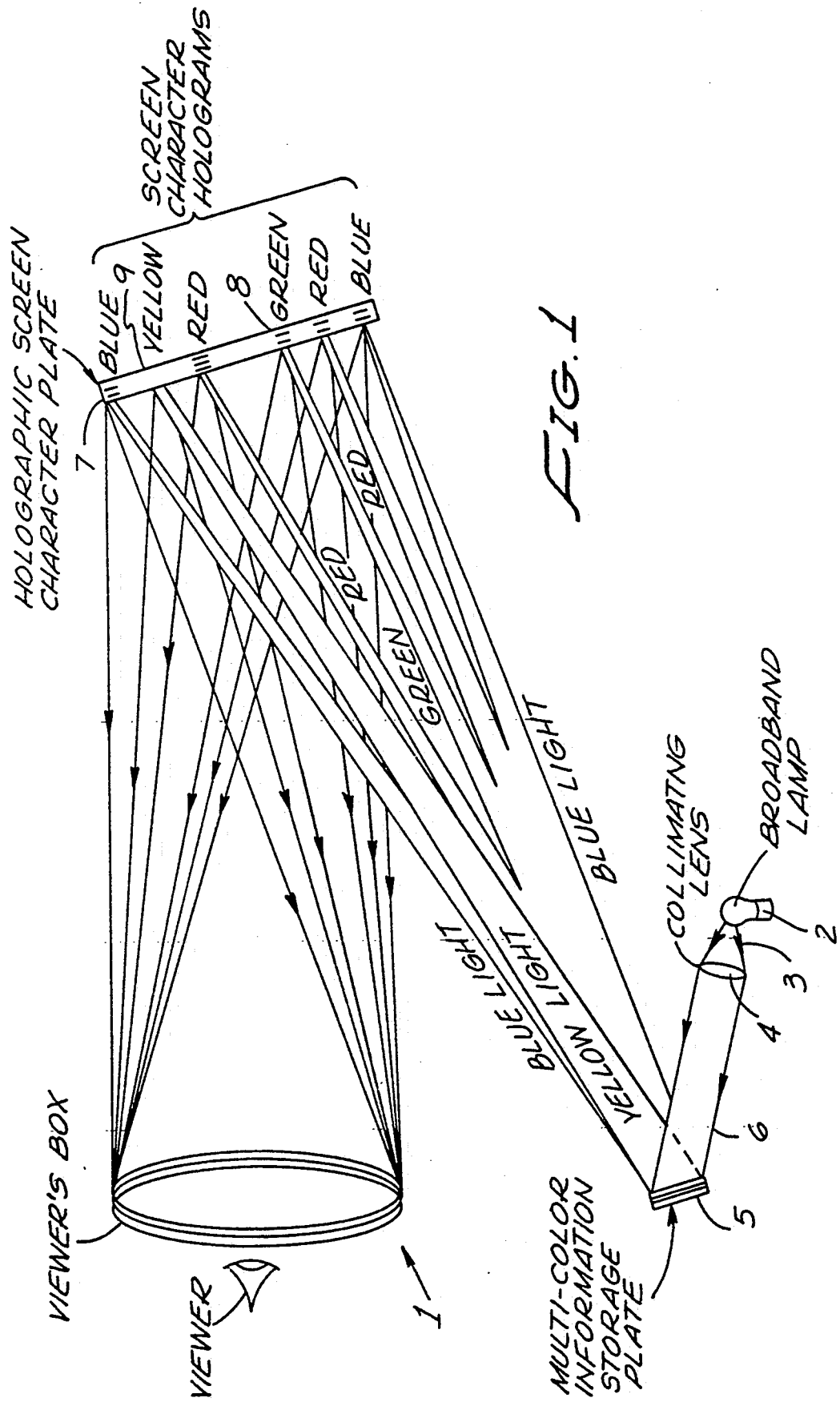
FIG. 1 is a diagrammatic view of a preferred embodiment of a holographic data retrieval and projection system in accordance with this invention.

Information storage plate 5 diffracts various colors of light from incident light beam 6 into the proper locations of characters on screen character storage plate 7. Thus, green incident light is diffracted by storage plate 5 entirely towards green diffracting characters 8 on storage plate 7. Yellow light is diffracted toward yellow diffracting characters 9 on storage plate 7, and so on. In many displays, such as those on an automobile instrument panel, the actual percentage of display area taken up by characters and objects such as needles is small, say less than 5%. Plate 5 advantageously directs all the light to the appropriate characters, thus achieving extremely efficient utilization of available light.

Plate 5 includes several holograms, each designed to diffract light over a predetermined, desired spectral bandwidth. The holograms can lie entirely within a single gelatin layer, or can consist of a stack of gelatin layers, each including one or more holograms. Plate 5 can consist of a large number of holograms, each having a desired narrow spectral bandwidth or a smaller number of holograms, each having a desired, broader spectral bandwidth. If the spectral response bandwidth for each hologram is sufficiently distinct from the others in the wavelengths the hologram reflects, the device performs better than if one or more holograms diffracts light whose bandwidth is outside the desired predetermined bandwidth for that hologram.

Figure 2:
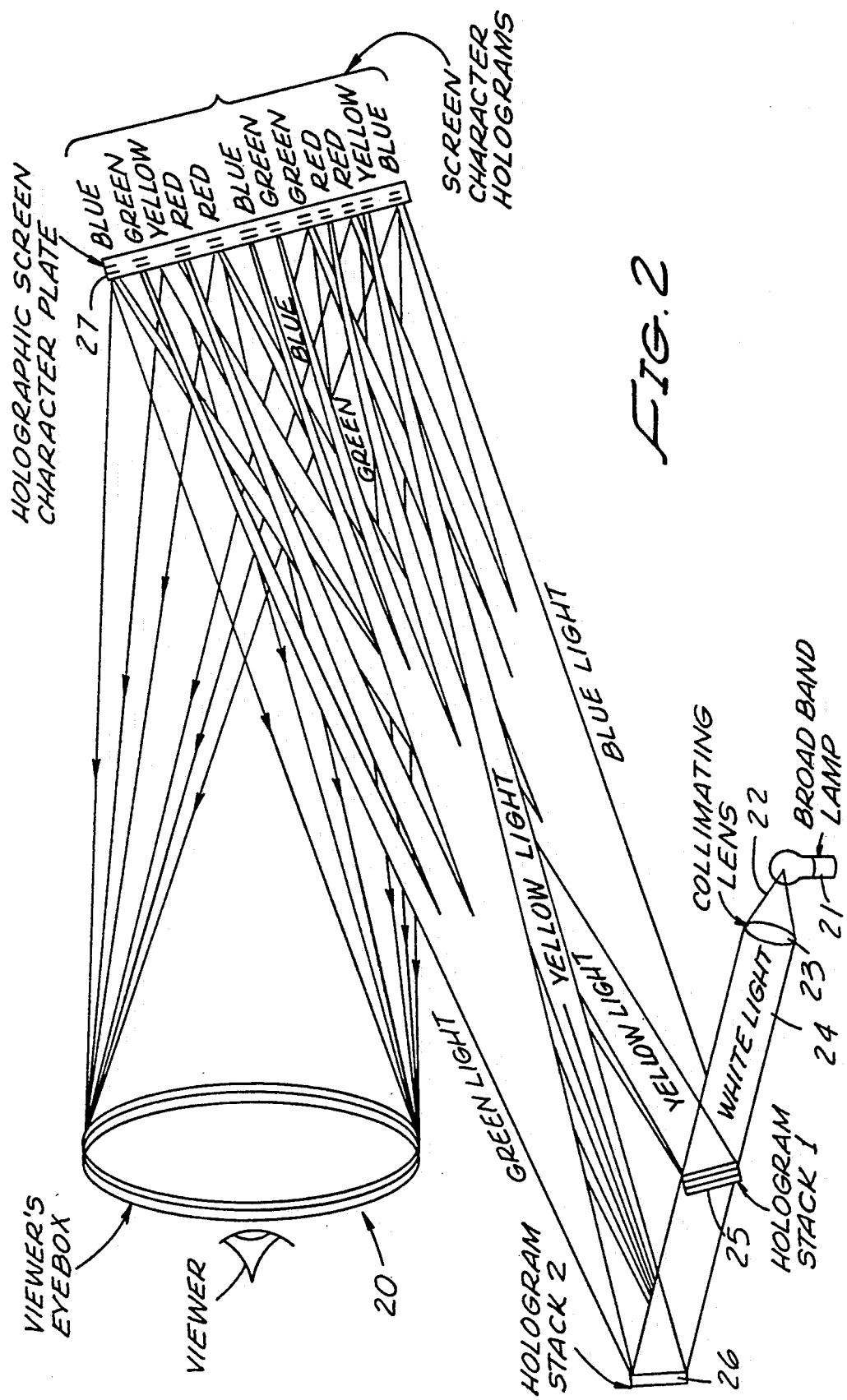
FIG. 2 is a diagrammatic view of a second preferred embodiment of a holographic data retrieval and projection system of this invention.

FIG. 2 shows a diagrammatic view of a second embodiment of a holographic data retrieval and projection system, generally designated 20. Here, broad bandwidth lamp 21 produces uncollimated white light beam 22. Lens 23 collimates light beams 22, producing beam 24 of collimated white light. White light beam 24 strikes first holographic information storage plate 25, which diffracts some of the light. Plate 25 transmits some incident light to second holographic information storage plate 26, which also diffracts light toward holographic screen character plate 27. The system illustrated in FIG. 2 functions in the same way as the system in FIG. 1, except that the holograms in plate 26 are tuned to respond to wavelength regions that plate 25 transmits. In this way, as much as 70% to 80% of the light incident on information storage plates 25 and 26 can be diffracted to screen character plate 27.

In principle, information storage plates 25 and 26 focus diffracted light onto screen character holograms, which produce sharply defined characters at the image plane. When the screen character image plane coincides with the plane of the screen character holograms, the images are sharply defined. However, when the images do not lie in the plane of the screen character holograms, two effects tend to blur the focused characters, namely, (1) the extent to which the light source is not a perfect point source, and (2) chromatic dispersion resulting from the tendency of a hologram to diffract each wavelength of light lying within its response bandwidth at a slightly different angle, thus causing a rainbow-like spread of the image. However, a lamp with a small filament such as the ANSI 1874 lamp provides a light source that approximates a point source sufficiently to produce negligible image blur. Further, designing the hologram fringes to lie nearly parallel to the surface by making the diffracted angle about equal to the incident angle minimizes chromatic dispersion. Each hologram can be tuned to a narrow spectral response bandwidth to reduce image blur further. However, to achieve maximum image brightness, a larger number of holograms are required to cover the spectrum of light from the light source.

For most applications sufficient blur remains in the image diffracted from the information storage plate to make this image unacceptable for direct viewing. The hologram screen characters provide a sharp outline of the symbols, not the light from the information storage plate itself. Thus, the information storage plate provides a spotlight focused narrowly on each screen character. Each spotlight can be a predetermined, desired shape. To reduce alignment requirements between the information storage plate and the screen character plate, each light spot can be somewhat larger than its corresponding character on the screen character plate. However, the greater the mismatch, the greater the reduction in optical efficiency and image brightness.

FIG. 3 shows that light 28 diffracted and reflected from the information storage plates shown in FIGS. 1 and 2 strikes an area surrounding a character 29 such as the numeral "5" on information storage plate 27. The screen character is a reflecting, diffracting optical diffusing screen made in the shape and size of a desired static character. The screen character diffracts light lying within a wavelength band which includes the incident light. The diffracted light forms a uniform, well-defined cone of diffuse light such as cones 30 and 31, and reflects these cones toward a viewer. If the viewer's exit pupil is sufficiently small and sufficiently far from screen character plate 27, the screen character hologram focuses light only into that narrow pupil. Thus, the screen does not scatter light in all directions, but scatters light very directionally, resulting in very bright images. Any light that is not diffracted from screen 27 passes through screen 27 and is absorbed by light-absorptive material 32.

FIG. 4 shows screen character hologram 33 that is tuned to diffract white light by having green, red and blue spotlights from the information storage plate illuminate a stack of green-diffracting, blue-diffracting and red-diffracting screen characters imposed atop one another at 34 to produce a cone of well-defined white light 35.

Figure 5:
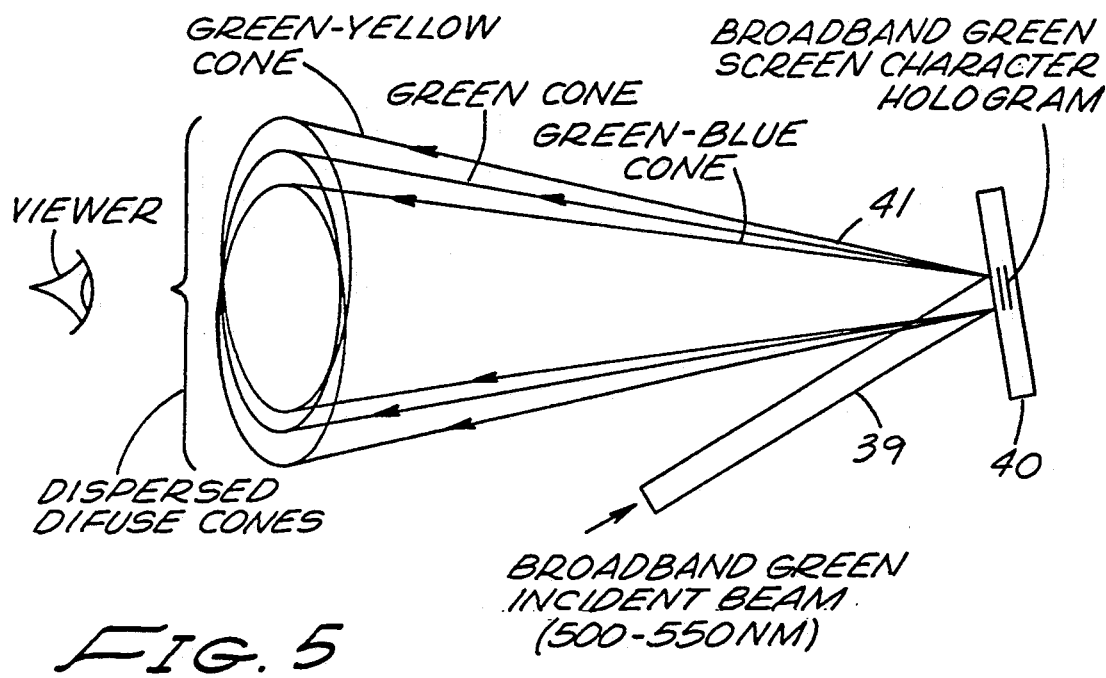
FIG. 5 shows the rainbow-like effect caused by chromatic dispersion on an image produced by the systems shown in FIG. 1.

FIG. 5 shows the effect of chromatic dispersion upon broadband incident green light beam 39 on broadband green screen character hologram plate 40. Reflected light beam 41 is not of a single wavelength, but lies within a spectral band. Chromatic dispersion causes the diffracted light from the screen character to comprise a fan of diffuse cones. However, since the image lies within the same plane as the holographic film, the image resolution is unaffected by chromatic dispersion. The dispersion causes a rainbow-like effect at the image only at the outer edges of the viewer's eyebox.

Figure 6:
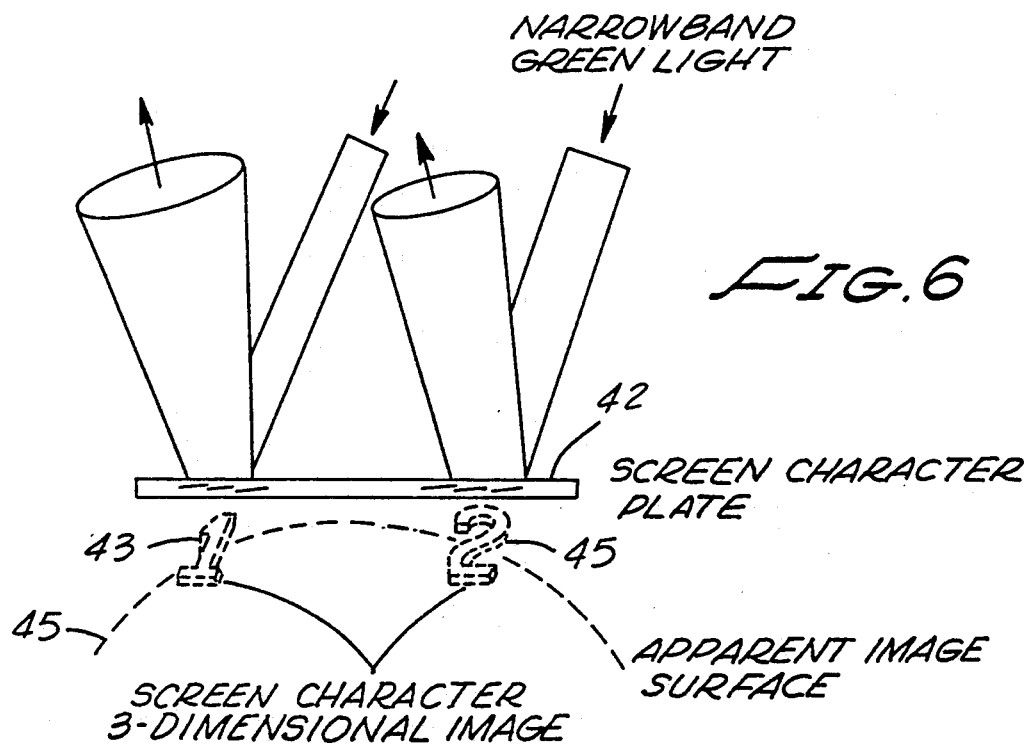
FIG. 6 shows a holographic screen character plate designed to create a three-dimensional screen character image not necessarily located in the plane of the screen character plate, which may require the holograms to have a narrow bandwidth of reflectance to avoid blurring of the images.

FIG. 6 shows an effect made feasible by illuminating the screen character holograms with a narrow band beam of light projected from a narrow band information storage hologram. In these circumstances, the positioning of characters on the screen character plate can be less precise because chromatic dispersion problems are smaller with such narrow band beams of light. Such beams also permit the use of three-dimensional characters. Further, if an image is projected to a viewer by a system that suffers from field curvature, the curvature can be compensated by opposite field curvature in the surface of plate 42. Under these circumstances, the screen character images 43 and 44 do not lie in a plane, but on a curved surface 45.

Figure 7:
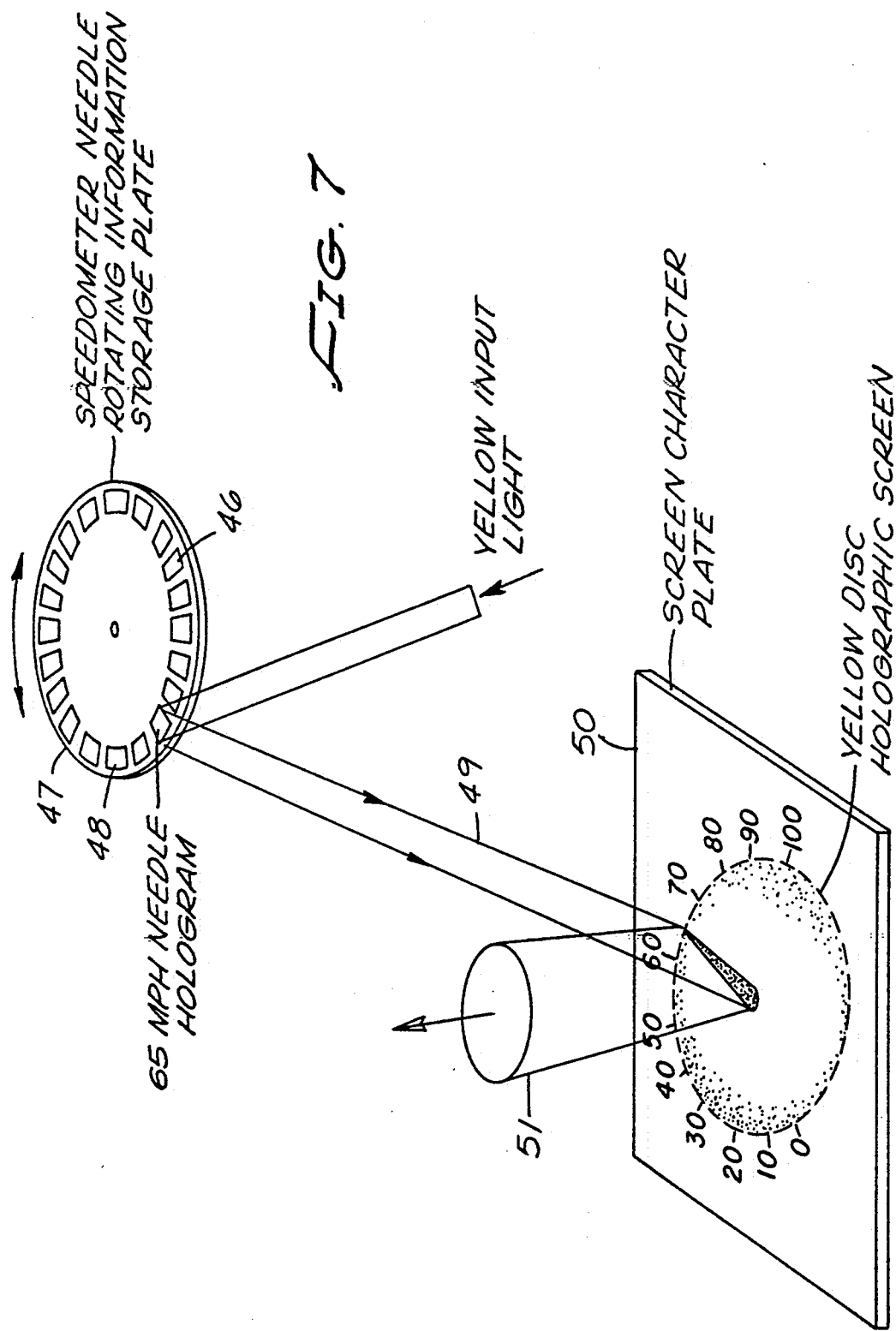
FIG. 7 shows a variation of the system shown in FIG. 1, here adapted to display changing information using a rotating or translating information storage plate.

FIG. 7 shows a variation of the systems of this invention to permit display of changing information. Here, the holographic information storage plate is a rotatable, translatable disc 46 carrying a plurality of stored holograms such as holograms 47 and 48. Each position of the rotatable, translatable holographic information storage plate produces a different diffracted image, and projects that image 49 onto holographic screen 50. Screen 50 diffracts this light in the form of light cone 51.

On an automobile instrument panel, the warning lights, the speedometer analog or digital reading, and the odometer reading are all changing information. To display this changing information, light is directed onto rotating or translating information storage plate 46. Each position of the speedometer needle, for example, can be stored in a separate hologram on plate 46. Plate 46 rotates in an amount proportional to the speed of the automobile. The incident light beam illuminates the correct storage hologram on plate 46, which projects the correct needle image onto screen character plate 50. In the center of screen character plate 50 is a screen disc designed to diffract any needle image focused on the screen. The holograms in the storage plate can be made to have a narrow bandwidth so that the resultant needle image on the screen character plate 50 is sharp and well-defined.

Figure 8:
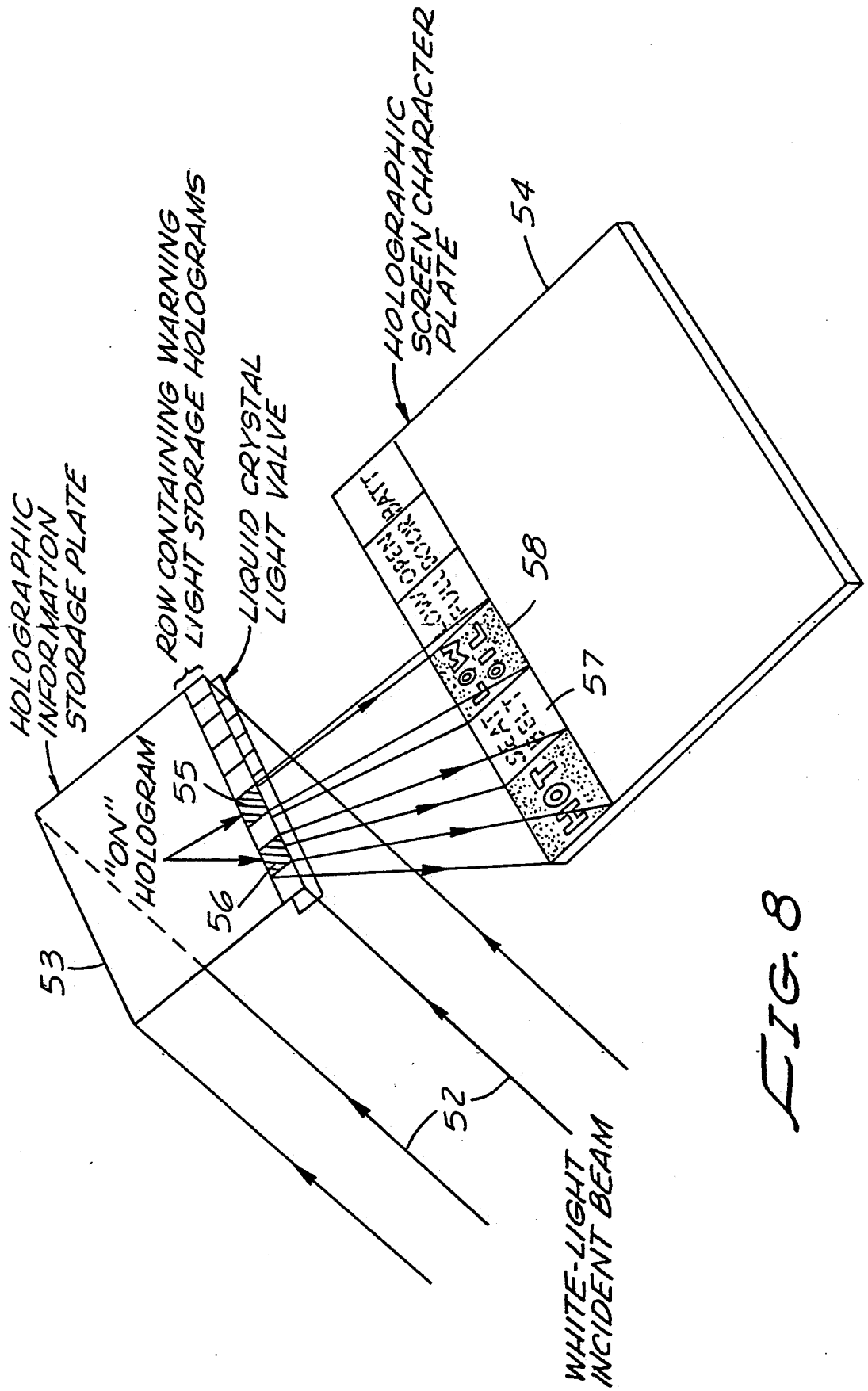
FIG. 8 shows an alternate system for displaying changing information using liquid-controlled light valves that contain the information storage plates.

FIG. 8 shows another system for displaying dynamic information using liquid crystal display panels. In FIG. 8, light beams 52 are incident on certain portions of information storage plate 53 covered by light valve material. The holograms under this light valve material are designed to diffract light to various warning symbols. Only when a particular segment of light valve material is electrically activated to be in the "open" position will light pass through, diffract from the information storage plate, pass back through the light valve, and be directed to the correct warning symbol on the screen character plate 54. Alternatively, the holograms, such as holograms 55 and 56 on plate 53, can be always in the "open" position, and the light valve can be placed above the row of green warning characters, such as characters 57 and 58 on plate 54. For added contrast, light valves at both storage plate 53 and screen character plate 54 can be used simultaneously.

The resulting displays have high brightness and contrast ratios yet consume little electrical power. Because lamp lifetime is dependent on power consumption, the low power requirements of these image sources results in long lamp lifetimes. The use of light valve material permits the entire display to be static increasing reliability. Further, the image source is lightweight and compact, an important advantage in displays in transportation vehicles having limited access to power outlets such as automobiles, planes, helicopters, ships and submarines.

Figure 9B:
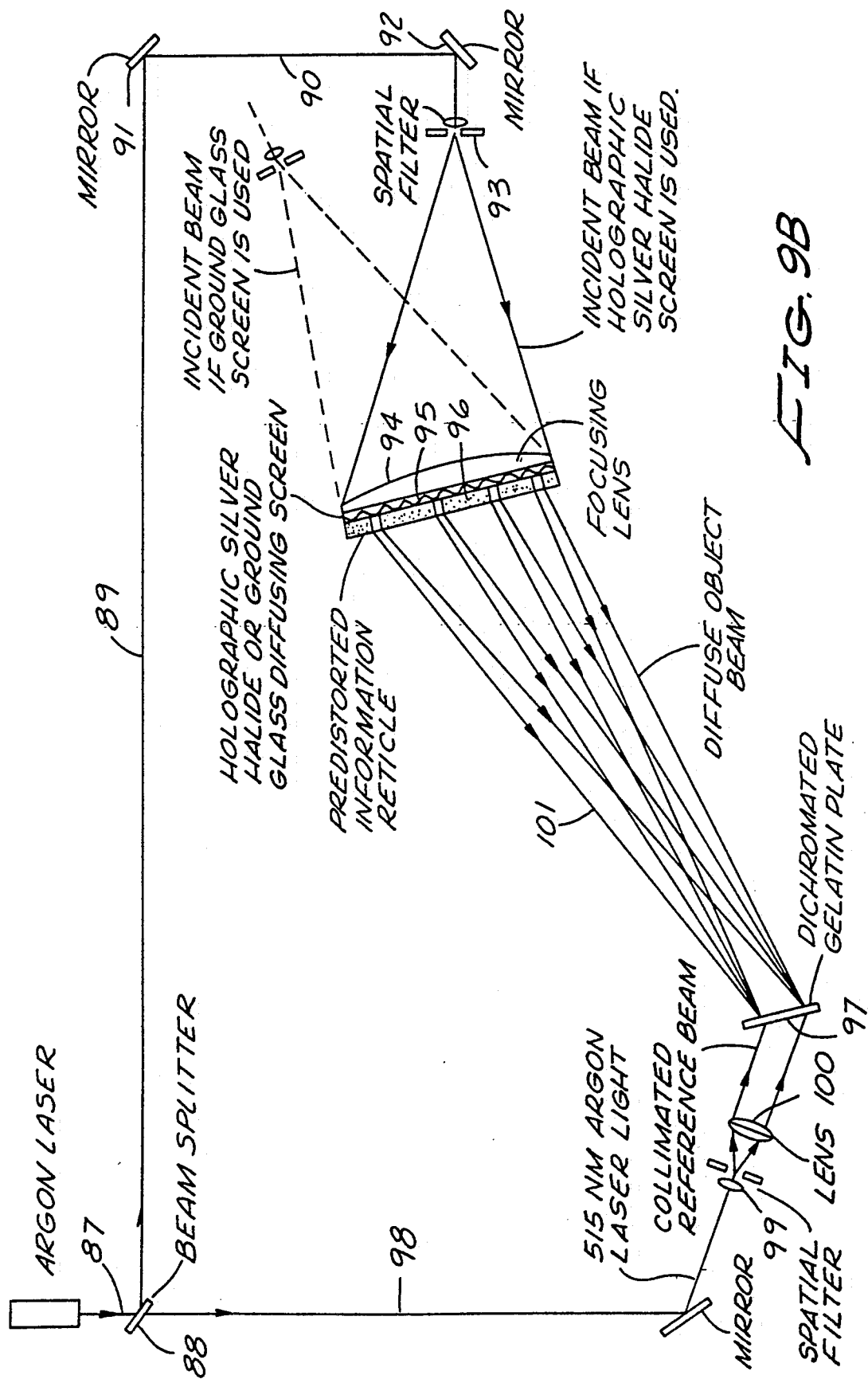

FIGS. 9A and 9B show preferred methods for making the information storage hologram plate. FIG. 9A is an exposure system for exposing a silver halide screen 66 for use in the information storage hologram exposure system. Exposure beam 68 is a collimated laser beam at a wavelength to which the unexposed silver halide screen 66 is sensitive. Beam splitter 70 delivers part of the beam through convex lens 72, which products a divergent beam. Gaussian apodizer 74 is positioned on the divergent beam path. Beyond the apodizer, collimating lens 76 produces broad beam 78 directed to screen 66. That portion of exposure beam 68 which passes through beam splitter 70 is reflected from mirrors 80 and 82 to a flashed opal screen 84 covered with a mask hologram opening in it. The flashed opal screen 84 is on a line substantially normal to the center of screen 66, and produces a diffuse beam with a spherical wave front. The result is an exposure of the silver halide screen to a standing wave interference pattern of the two beams.

After the exposure, screen 66 is developed and used in the memory element exposure system 86 of FIG. 9B. The exposure system is the preferred system for exposing the green information storage hologram.

In FIG. 9B, a 514.5 nm argon laser beam 87 is incident on a beam splitter 88 which reflects portion 89 of the beam, and transmits the rest 90 of it. Beam portion 89 reflects off two mirrors 91 and 92 and through a spatial filter onto plano-convex lens 94 which collimates the light. Directly beyond collimating lens 94 is silver halide diffusion screen 95 of FIG. 9A, which diffracts the light through predistorted information reticle 96 into a focused diffuse spot located at the surface of DCG holographic plate 97. Second half 98 of the split beam is projected from spatial filter 99 through collimating lens 100 and onto DCG plate 97, where it interferes with beam 101 from the silver halide diffuser to create standing wave patterns, which are recorded as a reflection hologram in the DCG plate.

Since the diffracted image direction of the hologram changes with changing playback wavelengths, the reticle image should be predistorted during exposure at the exposure wavelength. The result is, that for playback at the playback wavelength, the image will be rectilinear. To minimize exposure/playback problems, it is desirable to select an exposure wavelength close to the playback wavelength. Preferably, these methods use the 488 nm line of the argon laser for violet and blue holograms, the 515 nm argon line for green and yellow holograms, and the 647 nm krypton laser line for orange and red exposures. DCG is the preferred holographic film for the argon laser exposures because of its low-scatter properties and large dynamic range. For the krypton exposures, either dye-sensitized DCG, photopolymer film or other films may be used.

In the exposure system of FIG. 9B, silver halide diffusion hologram 95 is used because it forces a greater amount of light to DCG plate 97 than would a conventional diffusing screen, resulting in higher exposure intensities, and consequently shorter exposure and stabilization times. FIGS. 9A and 9B show the exposure system for green information holograms. The exposure systems for the blue and red information storage holograms is similar, except for different laser wavelengths.

In FIG. 9B, if desired, one could use a conventional diffusing screen instead of silver halide holographic screen 97. This would require the beam incident on the lens/diffuser/reticle combination to be aligned with the output diffuse beam, as shown in FIG. 9B.

Figure 10:
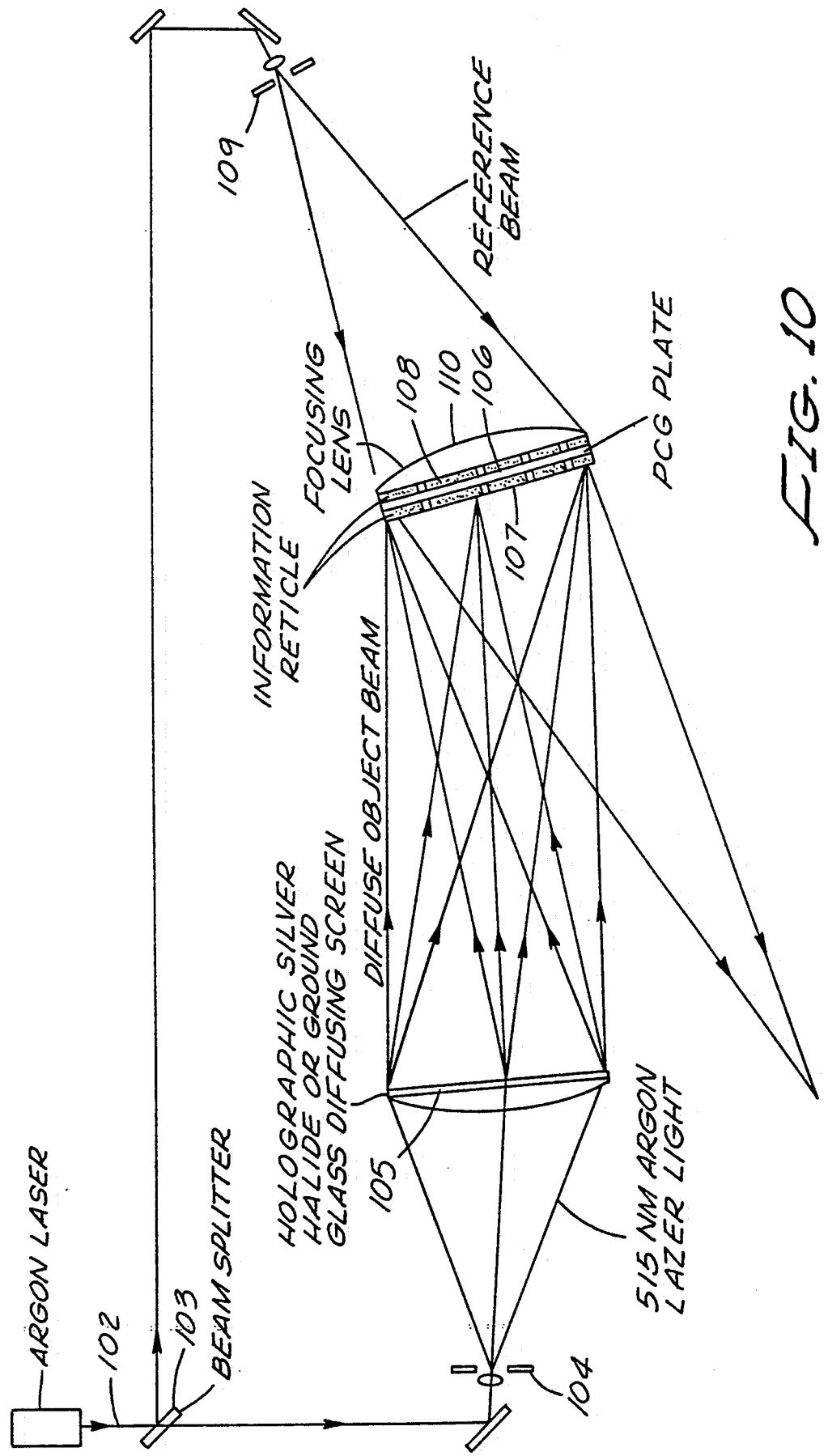
FIG. 10 shows a preferred method for making the holographic screen character plate shown in the systems of FIGS. 1 and 2.

FIG. 10 illustrates a preferred method for making green characters on the holographic screen character plate. Similar methods for the blue and red screen characters use the blue 488 nm argon line and the red 647 nm krypton laser line.

In FIG. 10, argon 515 nm beam 102 is split by beam splitter 103. Half of beam 102 is projected by spatial filter 104 through a collimating lens and diffuser 105 onto DCG plate 106 sandwiched between two identical information reticles 107 and 108 containing the screen characters. The diffusing screen may be either a conventional screen such as ground glass or flashed opal, or preferably a silver halide diffusion hologram which is exposed in a manner similar to that shown in FIG. 9A. The other half of beam 102 is projected by spatial filter 109 through focusing plano-convex lens 110 placed next to the screen reticle/DCG plate/screen reticle sandwich 108/106/107. The two beams interfere at the DCG plate, creating a standing wave which is recorded as a hologram in DCG plate 106.

FIG. 11 shows the use of the system of FIG. 1 in a diagram of a virtual image display system in an automobile. Light passes through optical fiber 60, and is directed onto collimating lens 61. Lens 61 transmits a narrow width beam 62 of highly collimated light onto information storage plate 63. Light reflected from storage plate 63 in the forms of beams 64, 65, 66, 67, 68 and 69 of distinct colors strikes holographic screen character plate 70, is diffracted onto metallized or dielectric folding half-mirror 71 along path 72, and is reflected to the surface of metallized or dielectric aspheric combiner 73. Images reflected as beam 74 then pass to the viewer.

In this system, a 10-watt, 1874 tungsten-filament lamp produces an image brightness of 8600 foot Lamberts for a white symbol at the viewer's eye for over a one hundred hour lifetime. However, because there is more than enough image brightness at 10 watts, by operating the light at only five watts of power consumption, the lamp life is extended to 21,000 hours and image brightness is still a more-than-adequate 1700 foot Lamberts.

What is claimed is:

1. A holographic data retrieval and projection system comprising: a low-power light source means for producing a collimated beam of white light; at least one reflective holographic information storage plate including a plurality of holographic elements wherein each of said elements diffracts incident light over a predetermined, desired spectral bandwidth; and a holographic screen character plate comprising a plurality of reflective screen character holograms in predetermined, desired shapes and sizes, each screen character hologram being adapted to diffract light lying within a wavelength band which includes the incident light thereon in a uniform well-defined bundle of diffuse light directed toward a viewer, each screen character hologram being tuned to diffract a predetermined, desired color of light, and to transmit all other light colors incident thereon, said information storage plate and said screen character storage plate being spaced from one another and oriented so that the various light colors diffracted from said information storage plate strike predetermined, desired screen character hologram locations on said screen character storage plate.

2. The system of claim 1 wherein said holographic elements in said storage plate lie entirely within a single gelatin layer.

3. The system of claim 1 wherein said holographic elements in said storage plate consist of a stack of gelatin layers each incorporating at least one hologram.

4. The system of claim 1 wherein said storage plates comprises a plurality of holographic elements each having a narrow response bandwidth.

5. The system of claim 1 wherein said storage plates comprises a plurality of holographic elements each having a relatively wide response bandwidth.

6. The system of claim 1 wherein said storage plates comprise a plurality of holographic elements each having a spectral bandwidth sufficiently different from the spectral bandwidths of physically adjacent holographic elements to minimize diffraction of undesired wavelengths of light by said adjacent holographic elements.

* * * * *